United States Patent
Pan et al.

(10) Patent No.: US 12,427,538 B2
(45) Date of Patent: Sep. 30, 2025

(54) METHOD FOR ROLLER-COATING LIQUID MATERIAL

(71) Applicant: CHANGZHOU SHICHUANG ENERGY CO., LTD, Jiangsu (CN)

(72) Inventors: Hao Pan, Jiangsu (CN); Changrui Ren, Jiangsu (CN); Liming Fu, Zhejiang (CN)

(73) Assignee: CHANGZHOU SHICHUANG ENERGY CO., LTD, Jiangsu (CN)

( * ) Notice: Subject to any disclaimer, the term of this patent is extended or adjusted under 35 U.S.C. 154(b) by 0 days.

(21) Appl. No.: 18/852,504

(22) PCT Filed: Sep. 15, 2022

(86) PCT No.: PCT/CN2022/119036
§ 371 (c)(1),
(2) Date: Sep. 30, 2024

(87) PCT Pub. No.: WO2023/184884
PCT Pub. Date: Oct. 5, 2023

(65) Prior Publication Data
US 2025/0229287 A1   Jul. 17, 2025

(30) Foreign Application Priority Data

Mar. 28, 2022   (CN) .......................... 202210309760.5

(51) Int. Cl.
*B05C 1/08*   (2006.01)
*B05C 11/10*   (2006.01)

(52) U.S. Cl.
CPC ........ *B05C 1/0895* (2013.01); *B05C 11/1039* (2013.01)

(58) Field of Classification Search
None
See application file for complete search history.

(56) References Cited

FOREIGN PATENT DOCUMENTS

| | | | |
|---|---|---|---|
| CN | 202238539 | | 5/2012 |
| CN | 104209227 | | 12/2014 |
| CN | 204672501 | | 9/2015 |
| CN | 204672501 U | * | 9/2015 |
| CN | 105728257 | | 7/2016 |
| CN | 215141450 | | 12/2021 |
| CN | 215141450 U | * | 12/2021 |
| CN | 114653522 | | 6/2022 |
| JP | H09108600 | | 4/1997 |

OTHER PUBLICATIONS

"International Search Report (Form PCT/ISA/210) of PCT/CN2022/119036", mailed on Dec. 28, 2022, with English translation thereof, pp. 1-5.

* cited by examiner

*Primary Examiner* — Alexander M Weddle
(74) *Attorney, Agent, or Firm* — JCIPRNET

(57) ABSTRACT

The present disclosure provides a method for roller-coating a liquid material, including roller-coating the liquid material on a silicon wafer with a liquid coating roller, and controlling a thickness of the liquid material carried on the liquid coating roller with a liquid taking roller, where a liquid retaining structure is provided at two ends of the liquid coating roller and/or two ends of the liquid taking roller, and the liquid retaining structure is configured to prevent the liquid material from flowing out from the two ends of the liquid coating roller and the two ends of the liquid taking roller.

7 Claims, No Drawings

METHOD FOR ROLLER-COATING LIQUID MATERIAL

CROSS-REFERENCE TO RELATED APPLICATION

This application is a 371 application of the International PCT application serial no. PCT/CN2022/119036, filed on Sep. 15, 2022, which claims the priority benefits of China application no. 202210309760.5, filed on Mar. 28, 2022. The entirety of each of the above-mentioned patent applications is hereby incorporated by reference herein and made a part of this specification.

TECHNICAL FIELD

The present disclosure relates to the field of photovoltaics, and in particular to a method for roller-coating a liquid material on a silicon wafer.

BACKGROUND

In the production of crystalline silicon solar cells, a roller coating device is used to roller-coat a liquid material on a surface of a silicon wafer. An existing roller coating device generally includes a roller bed configured to convey a silicon wafer, a liquid coating roller configured to roller-coat a liquid material on the silicon wafer on the roller bed, a liquid taking roller configured to transfer the liquid material to the liquid coating roller, a liquid supply pipe configured to supply the liquid material to the liquid taking roller and the liquid coating roller, and a lifting drive mechanism configured to drive the liquid taking roller and the liquid coating roller to move closer to or away from the roller bed. The silicon wafer is conveyed by the roller bed. The lifting drive mechanism is configured to drive the liquid taking roller and the liquid coating roller to move closer to the roller bed, such that the silicon wafer conveyed on the roller bed can be roller-coated by the liquid coating roller. The liquid material from the liquid supply pipe falls between the liquid taking roller and the liquid coating roller. Due to an open structure at two ends of the liquid taking roller and at two ends of the liquid coating roller, the liquid material will flow out from the two ends of the liquid taking roller and the two ends of the liquid coating roller. Consequently, the thickness of the liquid material between the liquid taking roller and the liquid coating roller is uneven. The liquid level of the liquid material in the middle of the liquid coating roller and the liquid level of the liquid material at the two ends of the liquid coating roller are different. Therefore, the liquid material carried on the liquid coating roller is non-uniform, resulting in non-uniform roller coating, and affecting the performance of the final produced crystalline silicon solar cell.

In addition, the liquid coating roller is generally made of a flexible material. For example, a sponge roller or a rubber roller is used as the liquid coating roller. Therefore, when the liquid material is roller-coated on the surface of the silicon wafer, the pressure applied by the liquid coating roller to the silicon wafer is relatively small, and cannot be directly measured by a pressure sensor. However, the pressure, as an important process parameter, has a great impact on the roller coating amount, and at present, there is no desirable method to detect the pressure.

SUMMARY

Technical Problems

Solutions to the Problems

Technical Solutions

In order to achieve more uniform roller coating, the present disclosure provides a method for roller-coating a liquid material, including roller-coating the liquid material on a silicon wafer arranged horizontally with a liquid coating roller arranged horizontally, and controlling a thickness of the liquid material carried on the liquid coating roller with a liquid taking roller parallel to the liquid coating roller, where a liquid retaining structure is provided at two ends of the liquid coating roller and/or at two ends of the liquid taking roller, and the liquid retaining structure is configured to prevent the liquid material from flowing out from the two ends of the liquid coating roller and the two ends of the liquid taking roller, such that the liquid material carried on the liquid coating roller is more uniform.

In a first preferred solution, the liquid retaining structure includes a pair of annular folded edges, and the pair of annular folded edges are respectively provided at the two ends of the liquid coating roller; and the pair of annular folded edges are coaxial with the liquid coating roller; and the liquid taking roller is located between the pair of annular folded edges, and the pair of annular folded edges respectively abut against end surfaces of the two ends of the liquid taking roller.

In a second preferred solution, the liquid retaining structure includes a pair of annular folded edges, and the pair of annular folded edges are respectively provided at the two ends of the liquid taking roller; and the pair of annular folded edges are coaxial with the liquid taking roller; and the liquid coating roller is located between the pair of annular folded edges, and the pair of annular folded edges respectively abut against end surfaces of the two ends of the liquid coating roller.

In a third preferred solution, the liquid retaining structure includes a pair of annular recessed grooves and a pair of liquid retaining raised rings, where the pair of annular recessed grooves are respectively provided at two ends of an outer circumferential surface of the liquid coating roller, and the pair of liquid retaining raised rings are respectively provided at two ends of an outer circumferential surface of the liquid taking roller; and the pair of annular recessed grooves are coaxial with the liquid coating roller; and the pair of liquid retaining raised rings are coaxial with the liquid taking roller; and the pair of annular recessed grooves are arranged to respectively correspond to the pair of liquid retaining raised rings, the pair of annular recessed grooves are configured to accommodate the pair of liquid retaining raised rings, respectively, and the pair of liquid retaining raised rings are configured to be embedded into the pair of annular recessed grooves, respectively.

The liquid coating roller is made of a flexible material, and the liquid coating roller may be a sponge roller or a rubber roller. In order to measure a pressure applied by the liquid coating roller to the silicon wafer during roller coating, the pair of annular recessed grooves and the pair of liquid retaining raised rings are each configured to have a trapezoidal cross-section; and the pair of annular recessed grooves are allowed to be in contact with the silicon wafer, and the pair of annular recessed grooves each form a stripe-like trace on the silicon wafer; and a width of the stripe-like trace is measured to determine a depression of the liquid coating roller according to the width of the stripe-like trace, and the pressure applied by the liquid coating roller to the silicon wafer is determined according to the depression of the liquid coating roller. Since the liquid coating roller is made of the flexible material, the width of the stripe-like trace formed by each of the pair of annular recessed grooves on the silicon wafer will be different depending on the depression of the liquid coating roller. Therefore, the depression of the liquid coating roller can be determined by measuring the width of the stripe-like trace.

BENEFICIAL EFFECTS OF THE PRESENT DISCLOSURE

Beneficial Effects

The present disclosure has the following advantages and beneficial effects. The method for roller-coating the liquid material according to the present disclosure can prevent the liquid material from flowing out from the two ends of the liquid coating roller and the two ends of the liquid taking roller, such that the liquid material carried on the liquid coating roller is more uniform to achieve more uniform roller coating. In addition, the present disclosure can measure the pressure applied by the liquid coating roller to the silicon wafer during roller coating.

DETAILED DESCRIPTION OF THE EMBODIMENTS

Preferred Implementations of the Present Disclosure

The specific implementations of the present disclosure will be further described below in conjunction with embodiments. The following embodiments are only used for describing the technical solutions of the present disclosure more clearly, and are not intended to limit the protection scope of the present disclosure.

Embodiment 1

A method for roller-coating a liquid material includes the following steps. A roller bed is used to convey a silicon wafer. The liquid material is roller-coated on the silicon wafer arranged horizontally and conveyed on the roller bed by using a liquid coating roller arranged horizontally. A thickness of the liquid material carried on the liquid coating roller is controlled with a liquid taking roller parallel to the liquid coating roller. The liquid material is supplied by a liquid supply pipe to the liquid coating roller and the liquid taking roller. The liquid supply pipe, the liquid taking roller, and the liquid coating roller are located exactly above the roller bed.

A liquid retaining structure is provided at two ends of the liquid coating roller. The liquid retaining structure includes a pair of annular folded edges. The pair of annular folded edges are respectively provided at the two ends of the liquid coating roller. The pair of annular folded edges are coaxial with the liquid coating roller. The liquid taking roller is located between the pair of annular folded edges. The pair of annular folded edges respectively abut against end surfaces of two ends of the liquid taking roller.

An output end of the liquid supply pipe is located exactly above the liquid taking roller. The output end of the liquid supply pipe is allowed to face the liquid taking roller. The output end of the liquid supply pipe is located between the pair of annular folded edges.

During roller coating, the liquid material from the liquid supply pipe falls between the liquid coating roller and the liquid taking roller. The pair of annular folded edges are configured to prevent the liquid material from flowing out from the two ends of the liquid coating roller and the two ends of the liquid taking roller, such that the liquid material carried on the liquid coating roller is more uniform to achieve more uniform roller coating, thereby improving the performance of a final produced crystalline silicon solar cell.

Embodiment 2

A method for roller-coating a liquid material includes the following steps. A roller bed is used to convey a silicon wafer. The liquid material is roller-coated on the silicon wafer arranged horizontally and conveyed on the roller bed by using a liquid coating roller arranged horizontally. A thickness of the liquid material carried on the liquid coating roller is controlled with a liquid taking roller parallel to the liquid coating roller. The liquid material is supplied by a liquid supply pipe to the liquid coating roller and the liquid taking roller. The liquid supply pipe, the liquid taking roller, and the liquid coating roller are located exactly above the roller bed.

A liquid retaining structure is provided at two ends of the liquid taking roller. The liquid retaining structure includes a pair of annular folded edges. The pair of annular folded edges are respectively provided at the two ends of the liquid taking roller. The pair of annular folded edges are coaxial with the liquid taking roller. The liquid coating roller is located between the pair of annular folded edges. The pair of annular folded edges respectively abut against end surfaces of two ends of the liquid coating roller.

An output end of the liquid supply pipe is located exactly above the liquid taking roller. The output end of the liquid supply pipe is allowed to face the liquid taking roller. The output end of the liquid supply pipe is located between the pair of annular folded edges.

During roller coating, the liquid material from the liquid supply pipe falls between the liquid coating roller and the liquid taking roller. The pair of annular folded edges are configured to prevent the liquid material from flowing out from the two ends of the liquid coating roller and the two ends of the liquid taking roller, such that the liquid material carried on the liquid coating roller is more uniform to achieve more uniform roller coating, thereby improving the performance of a final produced crystalline silicon solar cell.

Embodiment 3

A method for roller-coating a liquid material includes the following steps. A roller bed is used to convey a silicon wafer. The liquid material is roller-coated on the silicon wafer arranged horizontally and conveyed on the roller bed by using a liquid coating roller arranged horizontally. A thickness of the liquid material carried on the liquid coating roller is controlled with a liquid taking roller parallel to the liquid coating roller. The liquid material is supplied by a liquid supply pipe to the liquid coating roller and the liquid taking roller. The liquid supply pipe, the liquid taking roller, and the liquid coating roller are located exactly above the roller bed.

A liquid retaining structure is provided at two ends of the liquid coating roller and at two ends of the liquid taking roller. The liquid retaining structure includes a pair of annular recessed grooves and a pair of liquid retaining raised rings. The pair of annular recessed grooves are respectively provided at two ends of an outer circumferential surface of the liquid coating roller, and the pair of liquid retaining raised rings are respectively provided at two ends of an outer circumferential surface of the liquid taking roller.

The pair of annular recessed grooves are coaxial with the liquid coating roller. The pair of annular recessed grooves are each configured to have a trapezoidal cross-section. The trapezoidal cross-section is coplanar with an axis of the liquid coating roller. The trapezoidal cross-section is configured to have a height perpendicular to the axis of the liquid coating roller, an upper base closer to the axis of the liquid coating roller, and a lower base away from the axis of the liquid coating roller.

The pair of liquid retaining raised rings are coaxial with the liquid taking roller. The pair of liquid retaining raised rings are each configured to have a trapezoidal cross-section. The trapezoidal cross-section is coplanar with an axis of the liquid taking roller. The trapezoidal cross-section is configured to have a height perpendicular to the axis of the liquid taking roller, a lower base connected to the outer circumferential surface of the liquid taking roller, and an upper base away from the outer circumferential surface of the liquid taking roller.

The pair of annular recessed grooves are arranged to respectively correspond to the pair of liquid retaining raised rings. The pair of annular recessed grooves are configured to accommodate the pair of liquid retaining raised rings, respectively. The pair of liquid retaining raised rings are configured to be embedded into the pair of annular recessed grooves, respectively.

An output end of the liquid supply pipe is located exactly above the liquid taking roller. The output end of the liquid supply pipe is allowed to face the liquid taking roller. The output end of the liquid supply pipe is located between the pair of liquid retaining raised rings.

During roller coating, the liquid material from the liquid supply pipe falls between the liquid coating roller and the liquid taking roller. Since the output end of the liquid supply pipe is located between the pair of liquid retaining raised rings of the liquid taking roller, and the pair of liquid retaining raised rings are respectively embedded into the pair of annular recessed grooves of the liquid coating roller, the liquid material does not flow out from the two ends of the liquid taking roller and the two ends of the liquid coating roller. A region of the outer circumferential surface of the liquid coating roller located between the pair of annular recessed grooves serves as an effective roller coating region. The liquid material in the effective roller coating region of the liquid coating roller has an even thickness. That is, a liquid level of the liquid material in the middle of the effective roller coating region of the liquid coating roller is the same as a liquid level of the liquid material at two ends of the effective roller coating region of the liquid coating roller. The liquid material carried on the liquid coating roller can be more uniform to achieve more uniform roller coating, thereby improving the performance of a final produced crystalline silicon solar cell.

The liquid coating roller is made of a flexible material. The liquid coating roller may be a sponge roller or a rubber roller. A lifting drive mechanism is provided and is configured to drive the liquid taking roller and the liquid coating roller to move closer to or away from the roller bed. The pressure applied by the liquid coating roller to the silicon wafer during roller coating is controlled by the lifting drive mechanism.

In order to measure the pressure applied by the liquid coating roller to the silicon wafer during roller coating, the pair of annular recessed grooves on the outer circumferential surface of the liquid coating roller are allowed to be in contact with the silicon wafer. The pair of annular recessed grooves each form a stripe-like trace on the silicon wafer. Since the liquid coating roller is made of the flexible material, the width of the stripe-like trace formed by each of the pair of annular recessed grooves on the silicon wafer will be different depending on the depression of the liquid coating roller. Therefore, the depression of the liquid coating roller can be determined by measuring the width of the stripe-like trace. The pressure applied by the liquid coating roller to the silicon wafer can be determined according to the depression of the liquid coating roller.

The above description is only preferred embodiments of the present disclosure. It should be noted that those of ordinary skill in the art can make several improvements and modifications without departing from the technical principles of the present disclosure, and these improvements and modifications should also be considered as falling within the protection scope of the present disclosure.

The invention claimed is:

1. A method for roller-coating a liquid material, comprising roller-coating the liquid material on a silicon wafer with a liquid coating roller, and controlling a thickness of the liquid material carried on the liquid coating roller with a liquid taking roller, wherein a liquid retaining structure is provided at two ends of the liquid coating roller and/or two ends of the liquid taking roller, and the liquid retaining structure is configured to prevent the liquid material from flowing out from the two ends of the liquid coating roller and the two ends of the liquid taking roller;

the liquid retaining structure comprises a pair of annular recessed grooves and a pair of liquid retaining raised rings, wherein the pair of annular recessed grooves are respectively provided at two ends of an outer circumferential surface of the liquid coating roller, and the pair of liquid retaining raised rings are respectively provided at two ends of an outer circumferential surface of the liquid taking roller; and the pair of annular recessed grooves are arranged to respectively correspond to the pair of liquid retaining raised rings, the pair of annular recessed grooves are configured to accommodate the pair of liquid retaining raised rings, respectively, and the pair of liquid retaining raised rings are configured to be embedded into the pair of annular recessed grooves, respectively; and the pair of annular recessed grooves are allowed to be in contact with the silicon wafer, and the pair of annular recessed grooves each form a stripe-like trace on the silicon wafer; and a width of the stripe-like trace is measured to determine a depression of the liquid coating roller according to the width of the stripe-like trace, and a pressure applied by the liquid coating roller to the silicon wafer is determined according to the depression of the liquid coating roller.

2. The method for roller-coating the liquid material according to claim 1, wherein a liquid supply pipe is provided and is configured to supply the liquid material to the liquid taking roller and the liquid coating roller; and an output end of the liquid supply pipe is located exactly above the liquid taking roller, the output end of the liquid supply pipe is allowed to face the liquid taking roller, and the output end of the liquid supply pipe is located between the pair of liquid retaining raised rings.

3. The method for roller-coating the liquid material according to claim 1, wherein the pair of annular recessed grooves are each configured to have a trapezoidal cross-section, and the trapezoidal cross-section is configured to have a height perpendicular to an axis of the liquid coating roller, and an upper base closer to the axis of the liquid coating roller.

4. The method for roller-coating the liquid material according to claim 3, wherein the pair of liquid retaining raised rings are each configured to have a trapezoidal cross-section, and the trapezoidal cross-section is configured to have a height perpendicular to an axis of the liquid taking roller, and a lower base connected to the outer circumferential surface of the liquid taking roller.

5. The method for roller-coating the liquid material according to claim 1, wherein the liquid coating roller is a sponge roller or a rubber roller.

6. The method for roller-coating the liquid material according to claim 1, wherein a roller bed is provided and is configured to convey the silicon wafer; and the liquid taking roller and the liquid coating roller are located exactly above the roller bed.

7. The method for roller-coating the liquid material according to claim 1, wherein a lifting drive mechanism is provided and is configured to drive the liquid taking roller and the liquid coating roller to move closer to or away from a roller bed.

* * * * *